United States Patent
Takamichi

(10) Patent No.: US 6,615,388 B1
(45) Date of Patent: Sep. 2, 2003

(54) LOW POWER PATH MEMORY FOR VITERBI DECODERS

(75) Inventor: Toru Takamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 350 days.

(21) Appl. No.: 09/654,331

(22) Filed: Sep. 1, 2000

(30) Foreign Application Priority Data

Sep. 2, 1999 (JP) ........................................... 11-248740

(51) Int. Cl.[7] .............................................. H03M 13/00
(52) U.S. Cl. ...................................................... 714/795
(58) Field of Search ................................ 714/795, 796; 375/265, 341

(56) References Cited

U.S. PATENT DOCUMENTS 5,923,713 A * 7/1999 Hatakeyama ................ 375/341
6,374,387 B1 * 4/2002 Van den Berghe .......... 714/790

FOREIGN PATENT DOCUMENTS

| JP | 2-170725 | 7/1990 | | |
|---|---|---|---|---|
| JP | 6-260944 | 9/1994 | | |
| JP | 8-237145 | 9/1996 | | |
| JP | 0924702 A | * | 9/1997 | .......... H03M/13/12 |

OTHER PUBLICATIONS

Garrett et al., Low power architecture of soft–output Viterbi algorithm, 1998, University of VA, p. 1 to 6.*

* cited by examiner

Primary Examiner—Albert Decady
Assistant Examiner—Shelly A Chase
(74) Attorney, Agent, or Firm—Dickstein, Shapiro, Morin & Oshinsky, LLP.

(57) ABSTRACT

A path memory for a Viterbi decoder stores $2^{k-1}$ path select command signals generated a T interval earlier than reference clock timing. In response to a path select command signal that is generated at the reference clock timing corresponding to each of the $2^{k-1}$ rows, one of the stored path select command signals which correspond to two possible states of a 2T interval earlier than the reference clock timing and are separated from each other by a distance of $2^{k-2}$ rows, is selected for each row. A matrix array of memory cells are arranged in the $2^{k-1}$ rows. To achieve low power consumption, the memory, cells are divided into a first array of odd-numbered columns and a second array of even-numbered columns. Each row of the first-array memory cells is responsive to the row-corresponding path select command signal and the selected path select command signal for selecting one of four possible states latched in the memory cells of preceding odd-numbered columns a 2T interval earlier than the reference clock timing, and each row of the second-array memory cells is responsive to the row-corresponding path select command signal and the selected path select command signal for selecting one of four possible states latched in the memory cells of preceding even-numbered columns a 2T interval earlier than the reference clock timing. The first and second arrays alternately operate at 2T-intervals.

12 Claims, 14 Drawing Sheets k = 3 k = 4 k = 5   PRIOR ART

LOW POWER PATH MEMORY FOR VITERBI DECODERS

BACKGROUND OF THE INVENTION

1. Field of the Invention

The present invention relates generally to Viterbi decoders, and more specifically to a path memory for Viterbi decoders.

2. Description of the Related Art

A Viterbi decoder for decoding a transmitted convolutional code includes a branch metric calculator, ACS (add/compare/select) circuitry and a path memory. In the branch metric calculator, Hamming distances between received code words and estimated code words are calculated to produce branch metrics, which are used in the ACS circuitry to produce a number of path select command signals. The path memory is a matrix array of memory cells arranged in rows corresponding to the path select command signals. Usually, $N \times 2^{k-1}$ memory cells (where N is the number of stages or columns and k is the constraint length of the convolutional code) are required to implement the path memory. Since all memory cells are simultaneously operated at clock intervals and since the clock rate must be high for selecting a symbol according to the maximum likelihood sequence estimation algorithm, a significant amount of power is consumed.

Japanese Laid-Open Patent Application 8-237145 discloses a Viterbi decoder in which each memory cell of the path memory consists of two input selectors and two pairs of flip-flops. The input selectors are provided for selectively coupling the states of the N-th stage to the flip-flop pairs. The flip-flops of each pair are alternately clocked at one half the system clock rate to produce outputs for the (N+1)th stage. The outputs of the flip-flops of each pair are connected to one of intermediate selectors, which are in turn connected to two output selectors which are provided for selecting the outputs of the intermediate selectors. All selectors are controlled by signals from the ACS circuitry.

While the path memory of the aforesaid patent application becomes less complex, it requires a significant amount of modifications in the prior art ACS circuitry.

SUMMARY OF THE INVENTION

It is therefore an object of the present invention to provide a low power path memory for a Viterbi decoder without requiring modification of ACS circuitry.

According to a broader aspect of the present invention, there is provided a path memory for a Viterbi decoder, which comprises path selecting circuitry for producing a plurality of control signals from path select command signals generated by the Viterbi decoder a T interval earlier than reference clock timing and from two path select command signals which are generated by the Viterbi decoder a 2T interval earlier than the reference clock timing corresponding to two possible states separated from each other by a predetermined distance. A matrix array of memory cells are arranged in a plurality of rows. To achieve low power consumption, these memory cells are divided into a first array of odd-numbered columns (stages) and a second array of even-numbered columns. Each row of the first-array memory cells is responsive to a corresponding one of the control signals for selecting one of four possible states latched in the memory cells of preceding odd-numbered columns a 2T interval earlier than the reference clock timing, each row of the second-array memory cells being responsive to a corresponding one of the control signals for selecting one of four possible states latched in the memory cells of preceding even-numbered columns a 2T interval earlier than the reference clock timing, the first and second arrays alternately operating at 2T-intervals.

According to a second aspect, the present invention provides a path memory for a Viterbi decoder which generates $2^{k-1}$ path select command signals at T-intervals, where k is the constraint length of a convolutional code. The path memory comprises path selecting circuitry for storing the $2^{k-1}$ path select command signals generated a T interval earlier than reference clock timing. The path selecting circuitry is responsive to a path select command signal generated at the reference clock timing corresponding to each of a plurality of $2^{k-1}$ rows for selecting, for each row, one of the stored path select command signals corresponding to two possible states which occur a 2T interval earlier than the reference clock timing and are separated from each other by a distance of $2^{k-2}$ rows. A matrix array of memory cells is arranged in $2^{k-1}$ rows and is divided into a first array of odd-numbered columns and a second array of even-numbered columns. Each row of the first-array memory cells is responsive to the row-corresponding path select signal and the selected path select command signal for selecting one of four possible states latched in the memory cells of preceding odd-numbered columns a 2T interval earlier than the reference clock timing. Each row of the second-array memory cells is responsive to the row-corresponding the second-array memory cells is responsive to the row-corresponding path select command signal and the selected path select command signal for selecting one of four possible states latched in the memory cells of preceding even-numbered columns a 2T interval earlier than the reference clock timing. The first and second arrays are alternately operating at 2T-intervals.

BRIEF DESCRIPTION OF THE DRAWINGS

The present invention will be described in further detail with reference to the accompanying drawings, in which.

DETAILED DESCRIPTION

Figure 1:
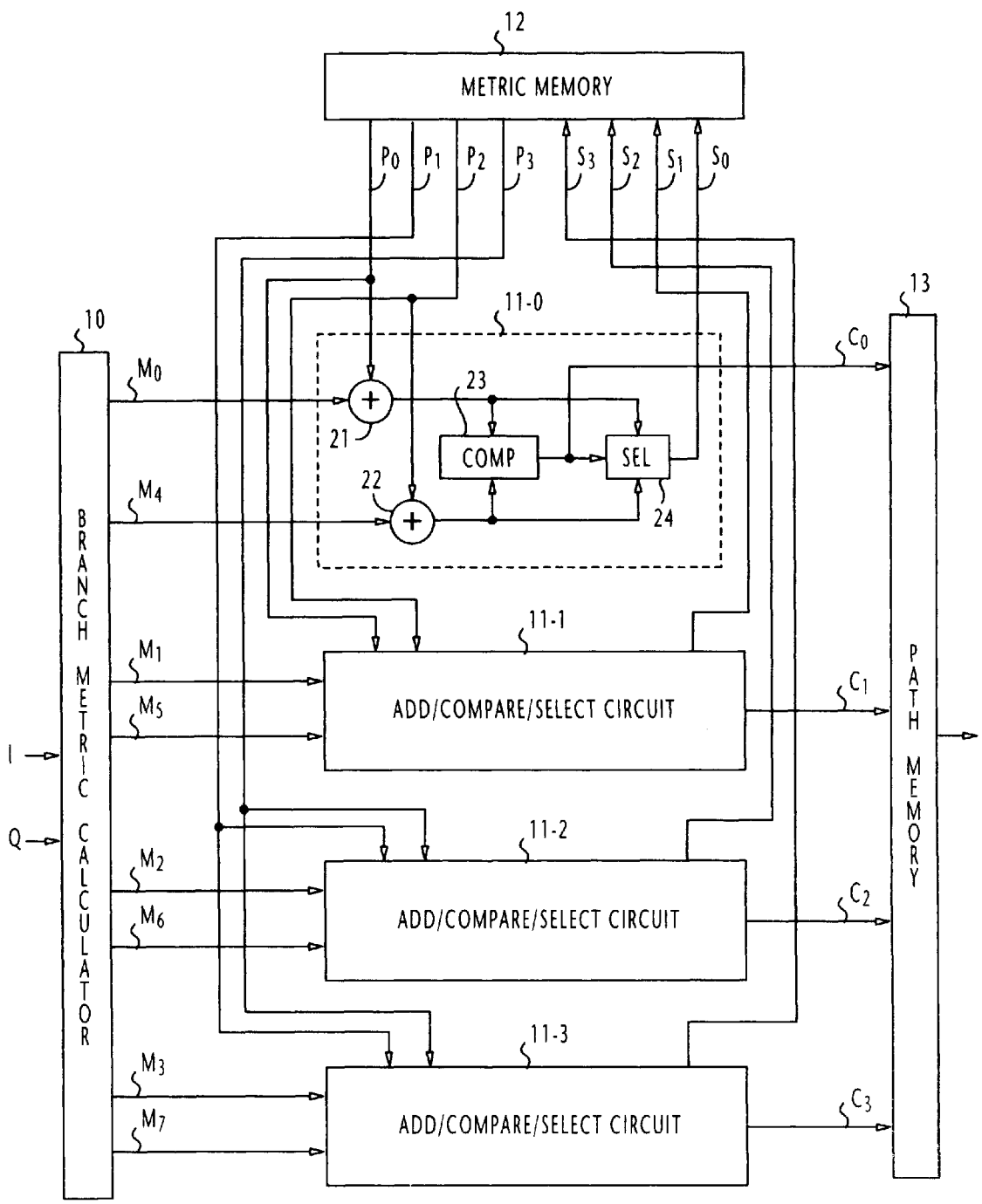
FIG. 1 is a block diagram of a Viterbi decoder.
Figure 2:
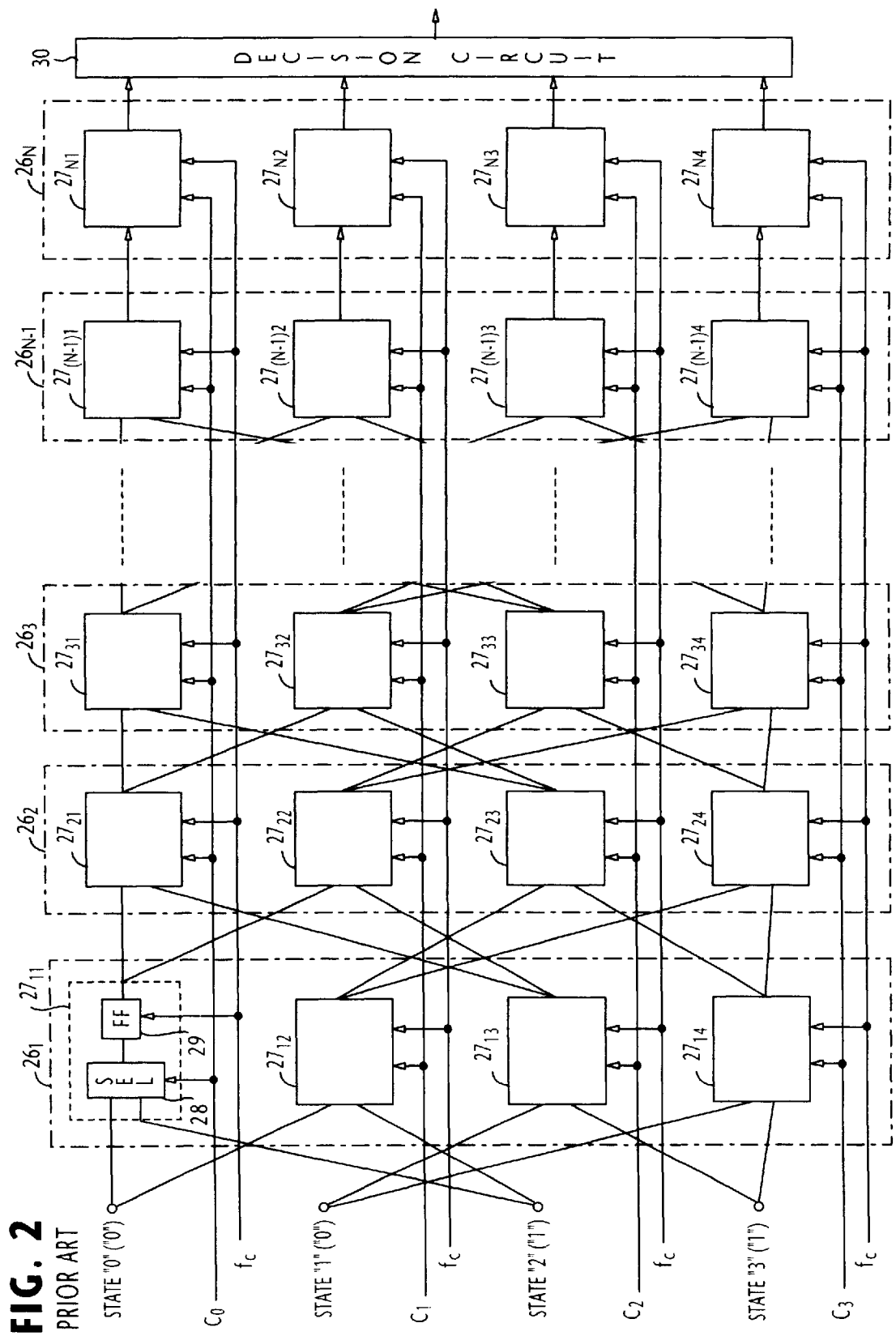
FIG. 2 is a block diagram of a prior art path memory of FIG. 1.

Before proceeding with the detailed description of the present invention, it may be appropriate to provide an explanation of the prior art with reference to FIGS. 1 and 2. At the transmit site, the source signal is transformed to a convolutional code and each code word is mapped to a particular point on the signal constellation of a QPSK (quadrature phase shift keying) and modulated onto the in-phase and quadrature components of a carrier.

In FIG. 1, the prior art Viterbi decoder is generally comprised by a branch metric calculator 10, a plurality of ACS (add/compare/select) circuits 11, a metric memory 12 and a path memory 13.

Branch metric calculator 10 receives the in-phase and quadrature components I and Q of the convolutional codes synchronously at clock frequency $f_c$. Branch metric calculator 10 calculates $2^k$ Hamming distances, or branch metrics, between the received code word and the $2^k$ possible transmitted code words, where k is the parameter known as the constraint length. The calculated branch metrics are represented by $M_0$ to $M_{2^k-1}$. Each of these branch metrics represents one of the possible $2^{k-1}$ states (i.e., paths) when a 0 or a 1 is received. For simplicity, the constraint length k is assumed to be "3" and hence the branch metric calculator 10 produces eight branch metrics $M_0$ to $M_7$ and there are four possible states 0, 1, 2 and 3 for the Viterbi decoder corresponding to the paths in the trellis (state) diagram.

ACS circuits 11-0 to 11-3 are of identical configuration. Each ACS circuit 11-i receives a pair of branch metrics $M_i$ and $M_{i+4}$ from the branch metric calculator 10. These branch metrics are summed in adders 21 and 22 with previous branch metrics $P_0$ and $P_2$ (or $P_1$ and $P_3$) supplied from the metric memory 12 synchronously at the clock frequency $f_c$. A comparator 23 compares the outputs of adders 21, 22 and produces a signal indicating which of the summed signals is the most likely symbol to have been transmitted. The summed signal indicated by the comparator 23 is selected by a selector 24 and applied as a branch metric $S_i$ to the metric memory 12 to update the corresponding previous branch metric. The output signal of the comparator 23 of each ACS circuit is further supplied to the path memory 13 where it is used as a path select command signal $C_i$.

As shown in FIG. 2, the path memory 13 includes a matrix array of memory cells 27 grouped into N columns, or stages $26_1$ to $26_N$ and four rows. Each of the memory cells 27 comprises a two-input selector 28 and a flip-flop 29. The selectors 28 of each row "i" is responsive to the path select command signal $C_i$ for selecting one of their two input signals.

Each flip-flop 29 is clocked at frequency $f_c$ to latch the output of the associated selector 28. The data latched in each stage in response to a clock pulse is passed to the next stage in response to the next clock pulse. The input terminals of selectors 28 of first- and second-row memories $27_{11}$ and $27_{12}$ are connected to receive states "0" and "1" (of binary "0") and one of these input states is selected according to the path select command signals $C_0$ and $C_1$ and stored in their flip-flops. The input terminals of selectors 28 of third- and four-row memories $27_{13}$ and $27_{14}$ are connected to receive states "2" and "3" (of both binary "1") and one of these input states is selected according to the path select command signals $C_2$ and $C_3$ for storage in their associated flip-flops. The latched data in the first stage are presented to the next stage as selected states. In a similar fashion, the memory cells of the second and subsequent stages are connected to the outputs of the memory cells of the preceding stages. In this way, all $N \times 2^{k-1}$ flip-flops 29 of the path memory 13 simultaneously operate at clock frequency $f_c$ to transfer the selected states from one stage to the next at intervals $T(=1/f_c)$. The signals that appear at the outputs of the final stage $26_N$ are entered to a decision circuit 30 where they are processed to identify the transmitted symbol according to the maximum likelihood sequence estimation algorithm or the majority-vote decision algorithm.

In the full-memory array of the prior art path memory for a convolutional code of constraint length k=3, path select command signals $C_0$, $C_1$, $C_2$ and $C_3$ are supplied from the ACS circuits for $2^{k-1}$ selecting states (paths) 0, 1, 2 and 3, respectively and the selected states are passed on from one stage to the next at clock intervals T.

Since all flip-flops of the path memory 13 of the prior art Viterbi decoder operate simultaneously at clock frequency $f_c$, they consumes a significant amount of power.

The present invention overcomes the prior art disadvantage by dividing the path memory into a first array of an odd-numbered stages (columns) and a second array of an even-numbered columns and alternately driving the first and second arrays at one half the frequency $f_c$ at which the prior art path memory is operated.

Before the description of the present invention proceeds, reference is first made to FIGS. 2 to 5 to explain the principle of separating the path memory structure into odd- and even-numbered arrays.

Figure 3:
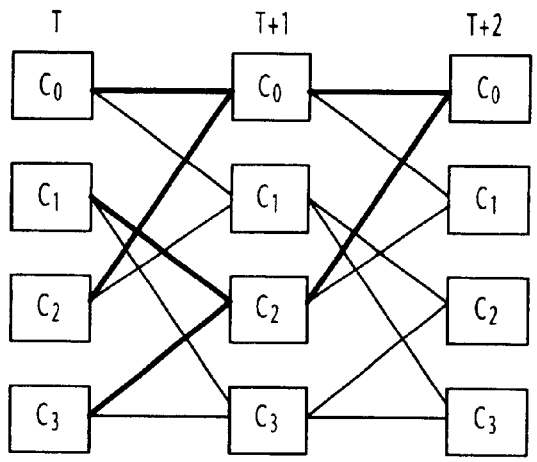
FIG. 3 is a block diagram of a three-stage network of the prior art path memory for a Viterbi decoder with a constraint length k=3.

If the constraint length k is 3, a three-stage network of the prior art path memory for time intervals T, T+1 and T+2 can be depicted as shown in FIG. 3. It is seen that in terms of path select command signals, each memory cell of the third stage (T+2) associates itself with two memory cells of preceding stage (T+1) and each of these preceding memory cells associates itself with two memory cells of the first stage T. Therefore, each memory cell of a given stage is associated with four memory cells of a preceding stage that is two clock intervals earlier than the memory cell of the given stage. For each memory cell, the distance between the two immediately preceding memory cells corresponds to two rows. As indicated by thick lines in FIG. 3, the immediately preceding associated memory cells $C_0(T+1)$ and $C_2(T+1)$ of memory cell $C_0(T+2)$, for example, are separated by two "rows". Similarly, a distance of two rows exists between the preceding memory cells $C_0(T)$ and $C_2(T)$ and between the memory cells $C_1(T)$ and $C_3(T)$.

Figure 4:
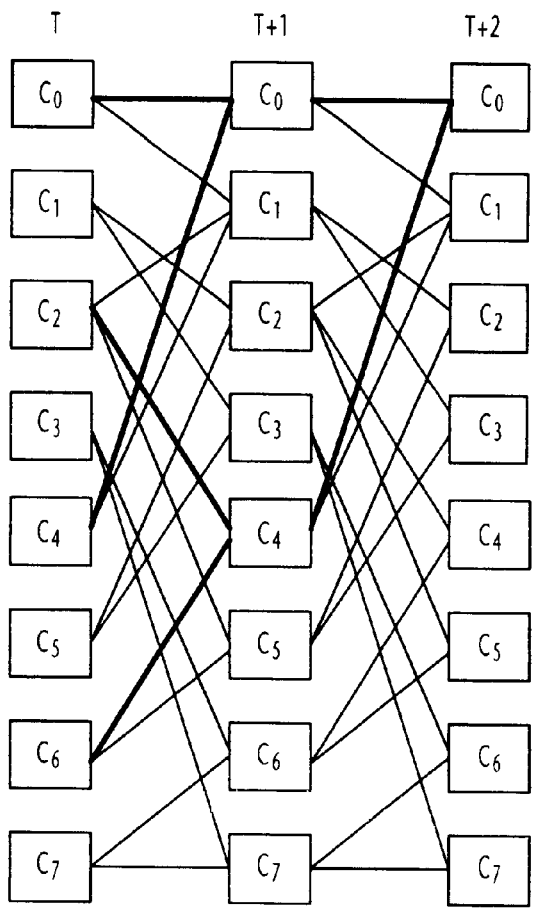
FIG. 4 is a block diagram of a three-stage network of the prior art path memory for a Viterbi decoder with a constraint length k=4.

A three-stage network of the prior art path memory for k=4 is shown in FIG. 4 in which thick lines indicate that the preceding memory cells $C_0(T+1)$ and $C_4(T+1)$ of their associated memory cell $C_0(T+2)$ are separated by four rows and similarly a distance of four rows exists the preceding memory cells $C_0(T)$ and $C_4(T)$ and between the memory cells $C_2(T)$ and $C_6(T)$.

Figure 5:
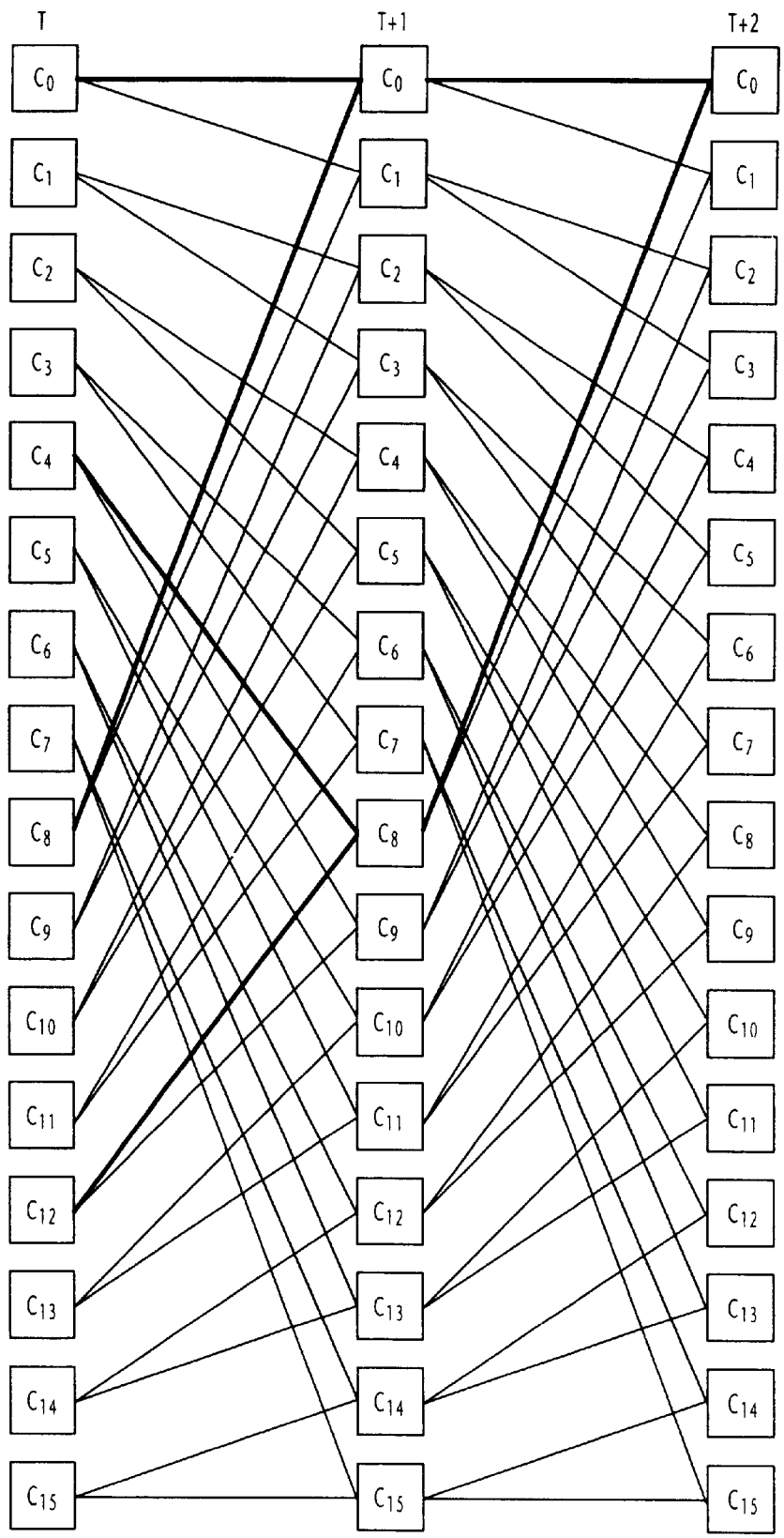
FIG. 5 is a block diagram of a three-stage network of the prior art path memory for a Viterbi decoder with a constraint length k=5.

In a three-stage network of the prior art path memory for k=5, the associated preceding memory cells of a subsequent memory cell is separated by a distance of eight rows. In FIG. 5, thick lines indicate that the preceding memory cells $C_0(T+1)$ and $C_8(T+1)$ of memory cell $C_0(T+2)$ are separated by eight rows and a distance of eight rows exists between the associated preceding memory cells $C_0(T)$ and $C_8(T)$ and between the associated memory cells $C_4(T)$ and $C_{12}(T)$.

Thus, each memory cell of the stage corresponding to time T+2 is associated with four possible states of the stage at time T which differ in location according to the constraint length k as follows:

k=3, $C_0$, $C_1$, $C_2$, $C_3$
k=4, $C_0$, $C_2$, $C_4$, $C_6$
k=5, $C_0$, $C_4$, $C_8$, $C_{12}$
k=6, $C_0$, $C_8$, $C_{16}$, $C_{24}$
k=7, $C_0$, $C_{16}$, $C_{32}$, $C_{48}$

In general terms, these four possible states are expressed by $C_0$, $C_2^{k-3}$, $C_2^{k-2}$, and $C_2^{k-3}+^{k-2}$, respectively. In addition, the two preceding memory cells at time T+1 which are associated with each subsequent memory cell are therefore separated from each other by a distance of $2^{k-2}$ rows (i.e., two rows for k=3, four rows for k=4, eight rows for k=5, sixteen rows for k=6, and thirty-two rows for k=7).

FIGS. 6A to 6H illustrate the principle of dividing a full-memory array of the prior art path memory into two arrays of odd- and even-numbered stages by using a three-stage network of the full-memory array with a constraint length k=3.

Figure 6A:
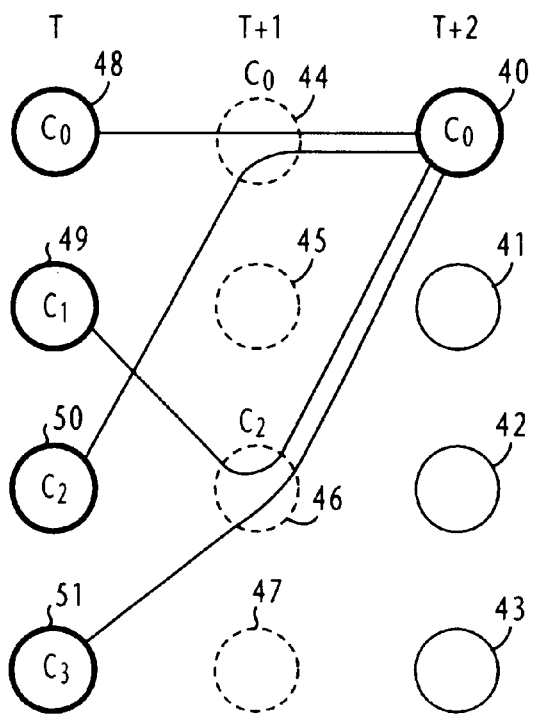
FIGS. 6A to 6H are schematic illustrations useful for explaining the path selecting principle of the present invention.
Figure 6B:
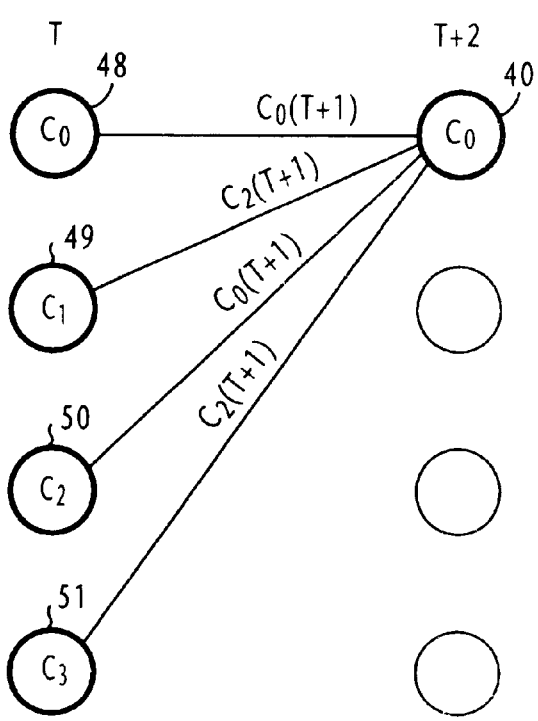
Figure 6C:
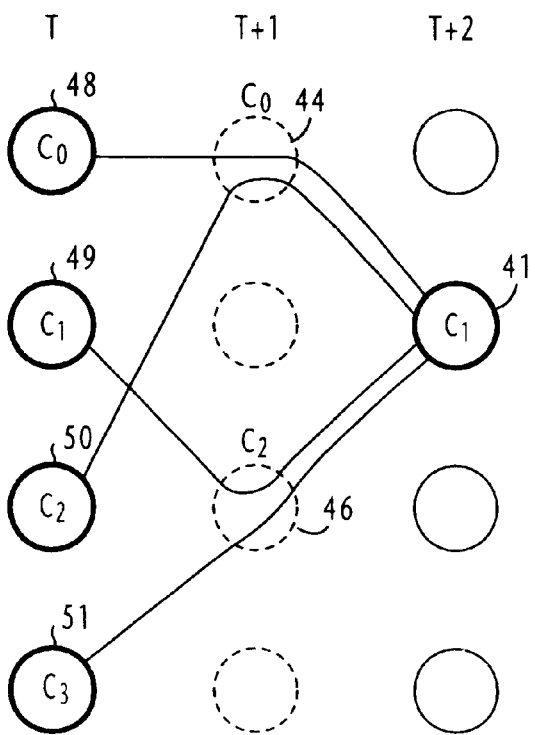
Figure 6D:
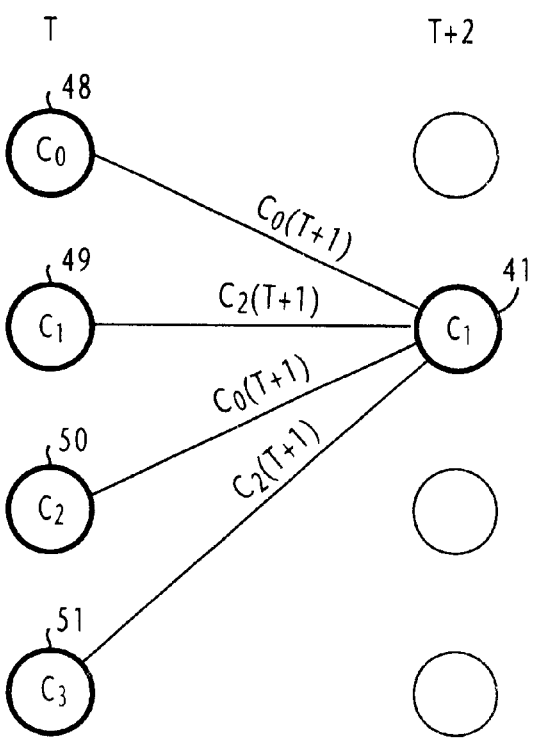
Figure 6E:
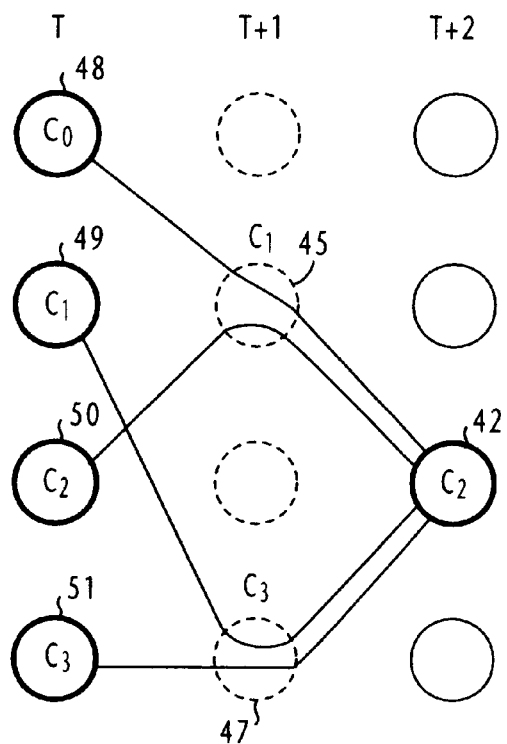
Figure 6F:
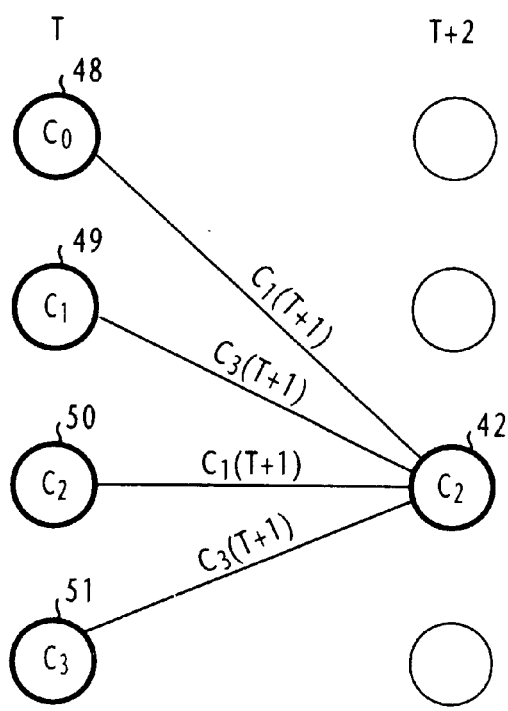
Figure 6G:
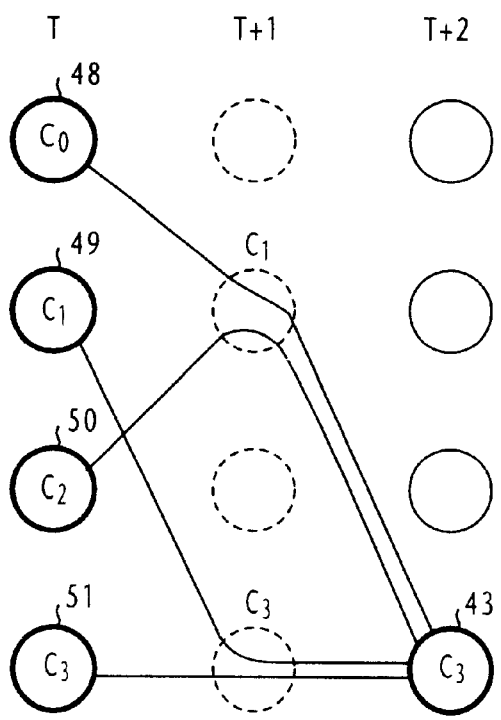
Figure 6H:
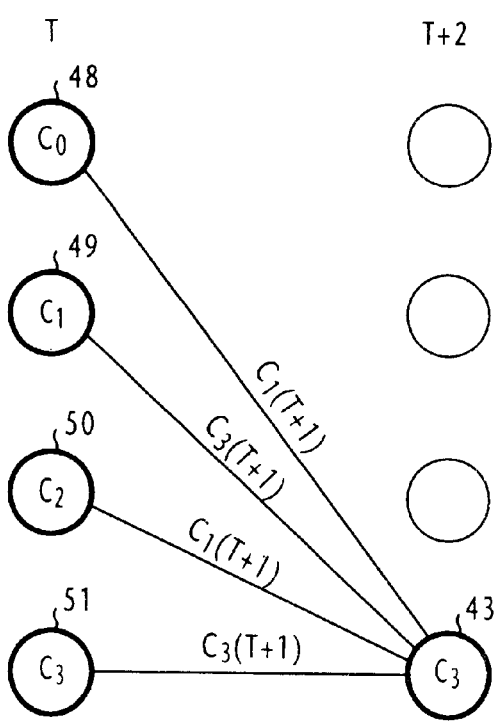

In FIG. 6A, consider a memory cell 40 of state "0" at time T+2 with respect to two preceding stages which occur at times T+1 and T. The state-0 memory cell 40 was associated with memory cells 44 and 46 at time T+1, and the memory cell 44 was associated with memory cells 48 and 50 at time T and the memory cell 46 was associated with memory cells 49 and 51. If all intermediate-stage memory cells 44 to 47 were removed from the three-stage network as shown in FIG. 6B and still the memory cell 40 were to operate properly, it would be necessary for the memory cell 40 to select one of the four input states which would have been selected at time T by memory cells 48, 49, 50 and 51 and at time T+1 by memory cells 44 and 46. Since the intermediate-stage memory cells 44 and 46 no longer exist, it is necessary for the memory cell 40 to use the path select command signal $C_0(T+2)$ and one of the path select command signals $C_0(T+1)$ and $C_2(T+1)$ which would have been used by the non-existent memory cells 44 and 46.

In a similar manner, the state-1 memory cell 41 (FIGS. 6C and 6D) is associated with the memory cells 44 and 46, which in turn were associated with the memory cells 48 to 51. Memory cell 41 would select one of the four input states of memory cells 48–51 by using the path command signal $C_1(T+2)$ as well as one of path select command signals $C_0(T+1)$ and $C_2(T+1)$. Likewise, the state-2 memory cell 42 (FIGS. 6E and 6F) is associated with the memory cells 45 and 47 which were associated with memory cells 48 to 51. In this case, the path select command signal $C_2(T+2)$ and one of the path command signals $C_1(T+1)$ and $C_3(T+1)$ would be used by memory cell 42 to select one of the four input states of memory cells 48–51. Similar to memory 42, the state-3 memory cell 43 (FIGS. 6G and 6H) would use the path select command signal $C_3(T+2)$ and one of the path command signals $C_1(T+1)$ and $C_3(T+1)$ for selecting one of the four input states of memory cells 48–51.

Figure 7:
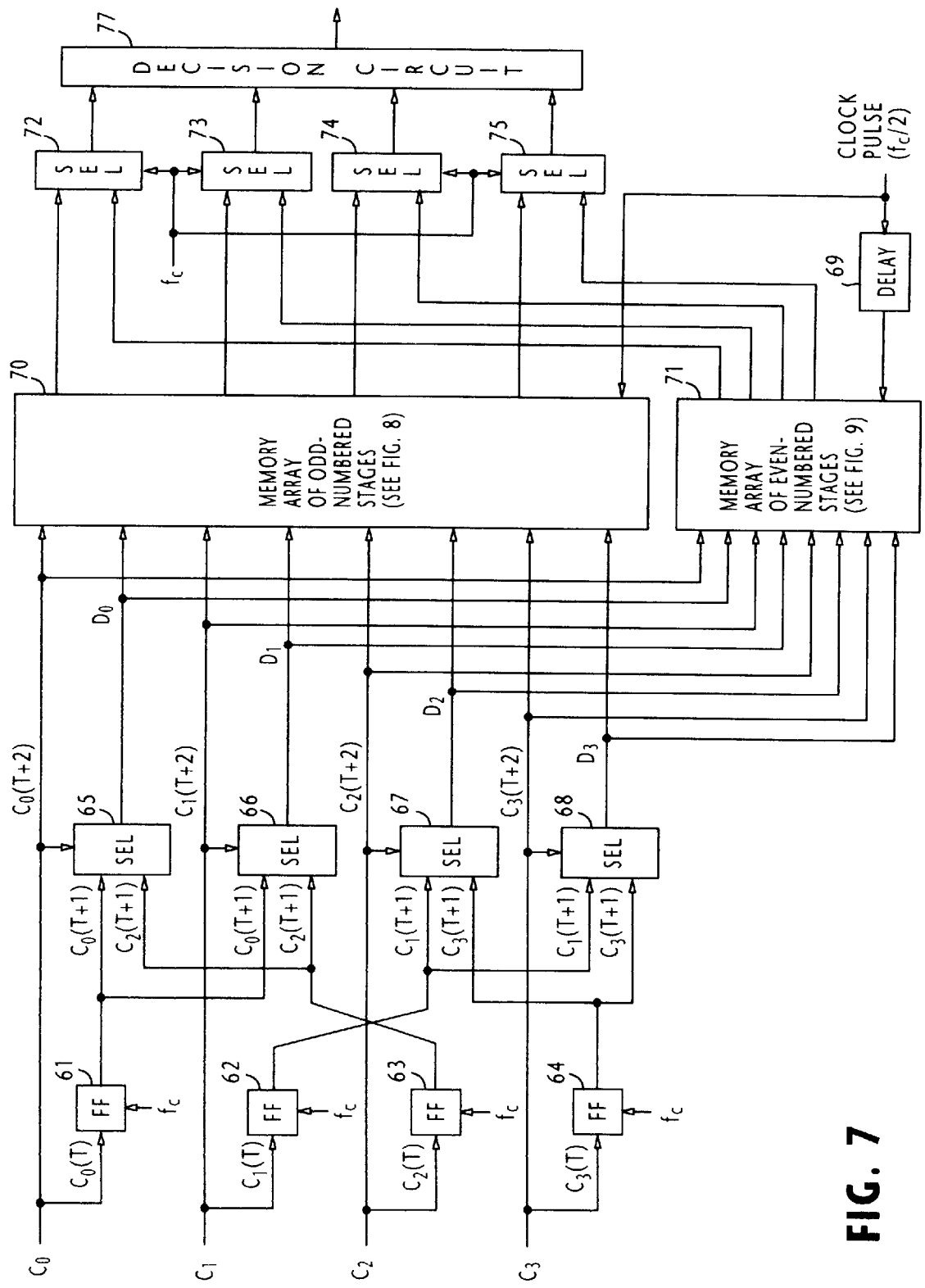
FIG. 7 is a block diagram of the path memory of the present invention.
Figure 8:
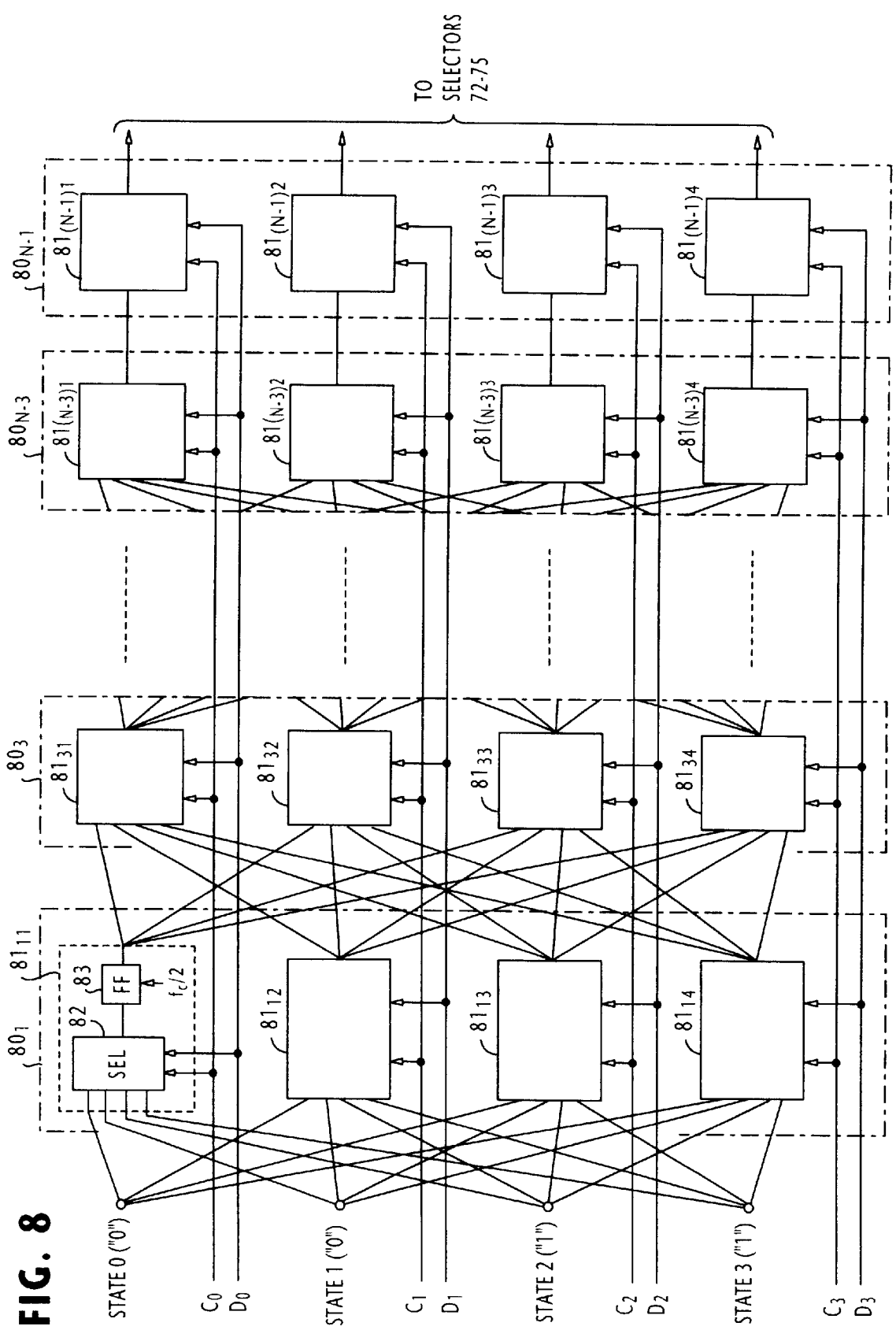
FIG. 8 is a block diagram of a memory array of odd-numbered stages of the path memory of the present invention.
Figure 9:
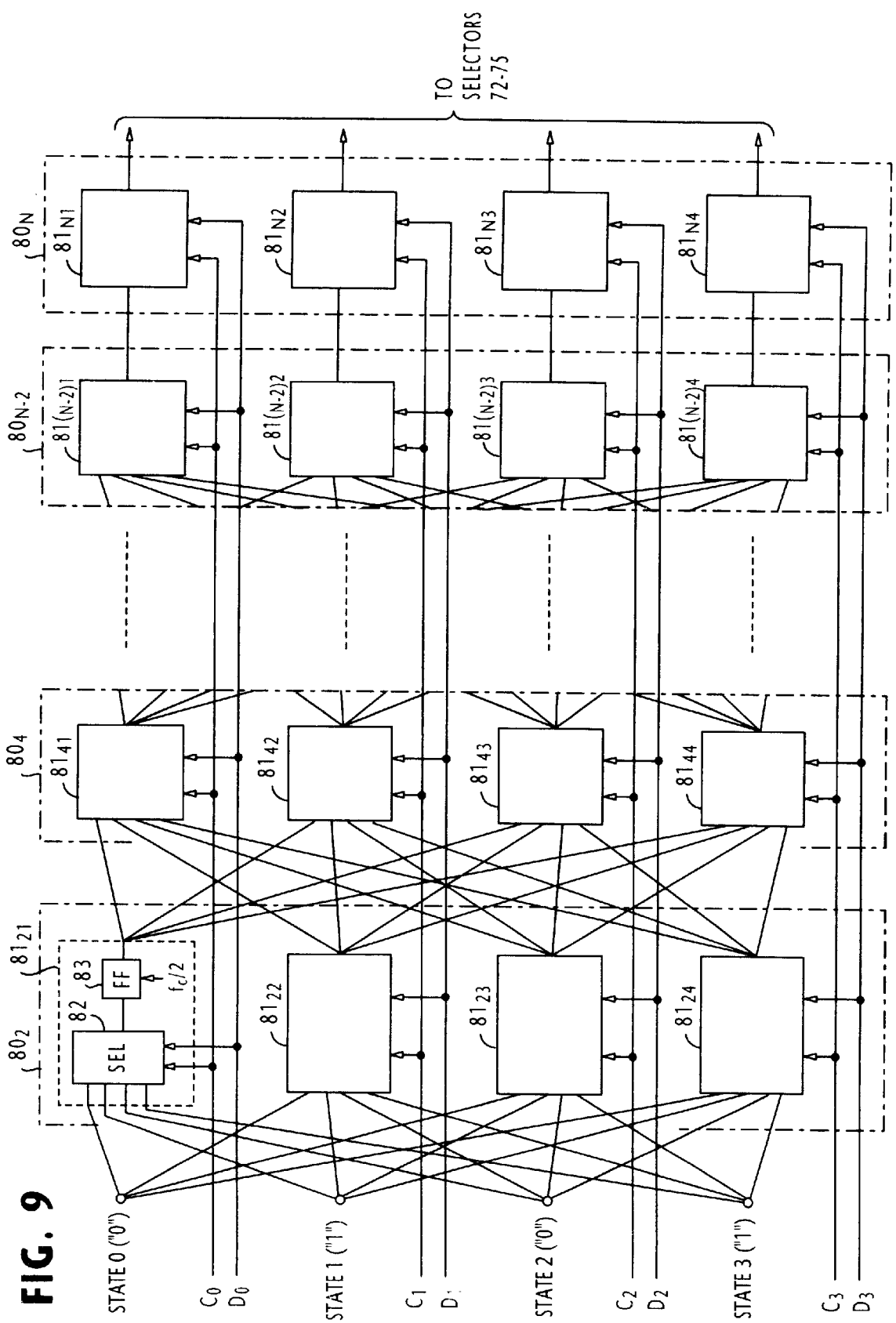
FIG. 9 is a block diagram of a memory array of even-numbered stages of the path memory of the present invention.

Referring now to FIG. 7, there is shown a path memory for Viterbi decoders of constraint length k=3 according to the present invention. In FIG. 7, the path memory is comprised by a first memory array 70 of odd-numbered stages and a second memory array 71 of even-numbered stages of identical configuration. Details of the memory arrays 70 and 71 are shown in FIGS. 8 and 9, respectively. Path select command signals $C_0(T)$–$C_3(T)$ from the ACS circuits 11 (FIG. 1) are respectively delayed by one-clock interval T by flip-flops 61 to 64 each driven by a clock pulse at frequency $f_c$. The T-delayed path select command signals are represented by $C_0(T+1)$, $C_1(T+1)$, $C_2(T+1)$ and $C_3(T+1)$ and supplied to selectors 65 to 68 which use the non-delayed path select command signals $C_0(T+2)$, $C_1(T+2)$, $C_2(T+2)$ and $C_3(T+2)$ for selecting the delayed path select command signals. Note that the memory cells of both arrays are implemented with the CMOS technology to take the advantage of its low power consumption.

Specifically, the selector 65 selects the even-numbered path select command signal $C_0(T+1)$ when the path select command signal $C_0T+2)$ is low, and selects the even-numbered path select signal $C_2(T+1)$ when $C_0(T+2)$ is high. Selector 66 selects the even-numbered path select command signal $C_0(T+1)$ when the path select command signal $C_1(T+2)$ is low, and selects the even-numbered path select signal $C_2(T+1)$ when $C_1(T+2)$ is high. Selector 67 selects the odd-numbered path select command signal $C_1(T+1)$ when the path select command signal $C_2(T+2)$ is low, and selects the odd-numbered path select signal $C_3(T+1)$ when $C_2(T+2)$ is high. Finally, the selector 68 selects the odd-numbered path select command signal $C_1(T+1)$ when the path select command signal $C_3(T+2)$ is low, and selects the odd-numbered path select signal $C_3(T+1)$ when $C_3(T+2)$ is high.

The output signals of selectors 65 to 68 are applied to the memory arrays 70 and 71 as input signals $D_0$ to $D_3$ along with the non-delayed path select command signals $C_0(T+2)$ to $C_3(T+2)$. The memory arrays 70 and 71 are alternately operated at twice the interval T. For this purpose, the memory array 70 is supplied with a clock pulse at frequency $f_c/2$ and the memory array 71 is supplied with a T interval delayed version of the clock pulse via a delay circuit 69.

Referring to FIG. 8, the odd-numbered memory array 70 includes an array of odd-numbered stages $80_1$, $80_3$, . . . , $80_{N-3}$ and $80_{N-1}$ of $2^{k-1}$ rows of memory cells 81, where k is the constraint length. In the illustrated embodiment, k is assumed to be 3. Thus, memory cells $81_{11}$ to $81_{14}$ are provided in the stage $80_1$ and so on.

Each of the memory cells 81 has four input terminals one of which is selected by a four-input selector 82. A flip-flop 83 is driven by a clock pulse that occurs at one half the clock frequency $f_c$ of the prior art to store the output of selector 82 for a clock interval 2T, instead of the clock interval T of the prior art.

In the odd-numbered array, the input terminals of each memory cell 81 of the stage $80_1$ are connected to states 0, 1, 2 and 3 and these states are represented by "0", "0", "1" and "1", respectively. The selectors 82 of the top-row memory cells $81_{11}$, $81_{31}$, . . . , $81_{(N-3)1}$ and $81_{(N-1)1}$ are supplied with path select command signals $C_0$ and $D_0$, and those of the second-row memory cells $81_{12}$, $81_{32}$, . . . , $81_{(N-3)2}$ and $81_{(N-1)2}$ are supplied with path select command signals $C_1$ and $D_1$. In a similar manner, the selectors 82 of the third-row memory cells $81_{13}$, $81_{33}$, . . . , $81_{(N-3)3}$ and $81_{(N-1)3}$ are supplied with path select command signals $C_2$ and $D_2$, and those of the bottom-row memory cells $81_{14}$, $81_{34}$, . . . , $81_{(N-3)4}$ and $81_{(N-1)4}$ are supplied with path select command signals $C_3$ and $D_3$.

The selector 82 of each memory cell selects one of its four input states according to one of four possible binary levels of the path select command signals $C_i$ and $D_i$. The selected state is latched for a 2T interval in the associated flip-flop 83 and then passed to the next memory stage. Each memory cell 81 of the third to the (N–3)th stages receives inputs from the outputs of all memory cells 81 of the preceding stages, while each memory cell 81 of the final stage (N−1)th is connected to the output of the memory cell 81 of the same row of the (N−3)th stage.

The even-numbered memory array 71 is shown in FIG. 9. This memory array includes an array of even-numbered stages $80_2, 80_4, \ldots, 80_{N-4}$ and $80_N$ of $2^{k-1}$ rows of memory cells 81. Thus, memory cells $81_{21}$ to $81_{24}$ are provided in the stage $80_2$ and so on.

Each of the memory cells 81 of the even-numbered array is identical in configuration to the memory cells of the odd-numbered array. Note that these memory cells are driven at the same frequency $f_c/2$ as the memory cells of the odd-numbered array, but delayed by interval T ($=1/f_c$) with respect to the clock pulses of the odd-numbered array.

In the even-numbered array, the input terminals of each memory cell 81 of the stage $80_2$ are connected to states 0, 1, 2 and 3. Notice that the states 0, 1, 2 and 3 are represented by "0", "1", "0" and "1", respectively, rather than by the "0", "0", "1" and "1" of the odd-numbered array. The selectors 82 of the top-row memory cells $81_{21}, 81_{41}, \ldots, 81_{(N-2)1}$ and $81_{N1}$ are supplied with path select command signals $C_0$ and $D_0$, and those of the second-row memory cells $81_{22}, 81_{42}, \ldots, 81_{(N-4)2}$ and $81_{N2}$ are supplied with path select command signals $C_1$ and $D_1$. In a similar manner, the selectors 82 of the third-row memory cells $81_{23}, 81_{43}, \ldots, 81_{(N-4)3}$ and $81_{N3}$ are supplied with path select command signals $C_2$ and $D_2$, and those of the bottom-row memory cells $81_{24}, 81_{44}, \ldots, 81_{(N-4)4}$ and $81_{N4}$ are supplied with path select command signals $C_3$ and $D_3$.

Similar to the odd-numbered array 70, the selector 82 of each memory cell of the even-numbered array 71 selects one of its four input states according to a particular combination of path select command signals $C_i$ and $D_i$ and the selected state is latched for a 2T interval in the associated flip-flop 83. Each memory cell 81 of the fourth to the (N−2)th stages receives inputs from the outputs of all memory cells 81 of the preceding stages, while each memory cell 81 of the final stage N is connected to the output of the memory cell 81 of the same row of the (N−2)th stage.

The outputs of the memory arrays 70 and 71 are respectively coupled to selectors 72 to 75. Each of the selectors 72 to 75 responds to the logic levels of the clock pulse ($f_c$) to alternately select one of the corresponding output states of the memory arrays 70 and 71 and delivers the selected state to a known decision circuit 77 which operates according to the maximum likelihood sequence estimation or majority-vote decision algorithm.

Figure 10:
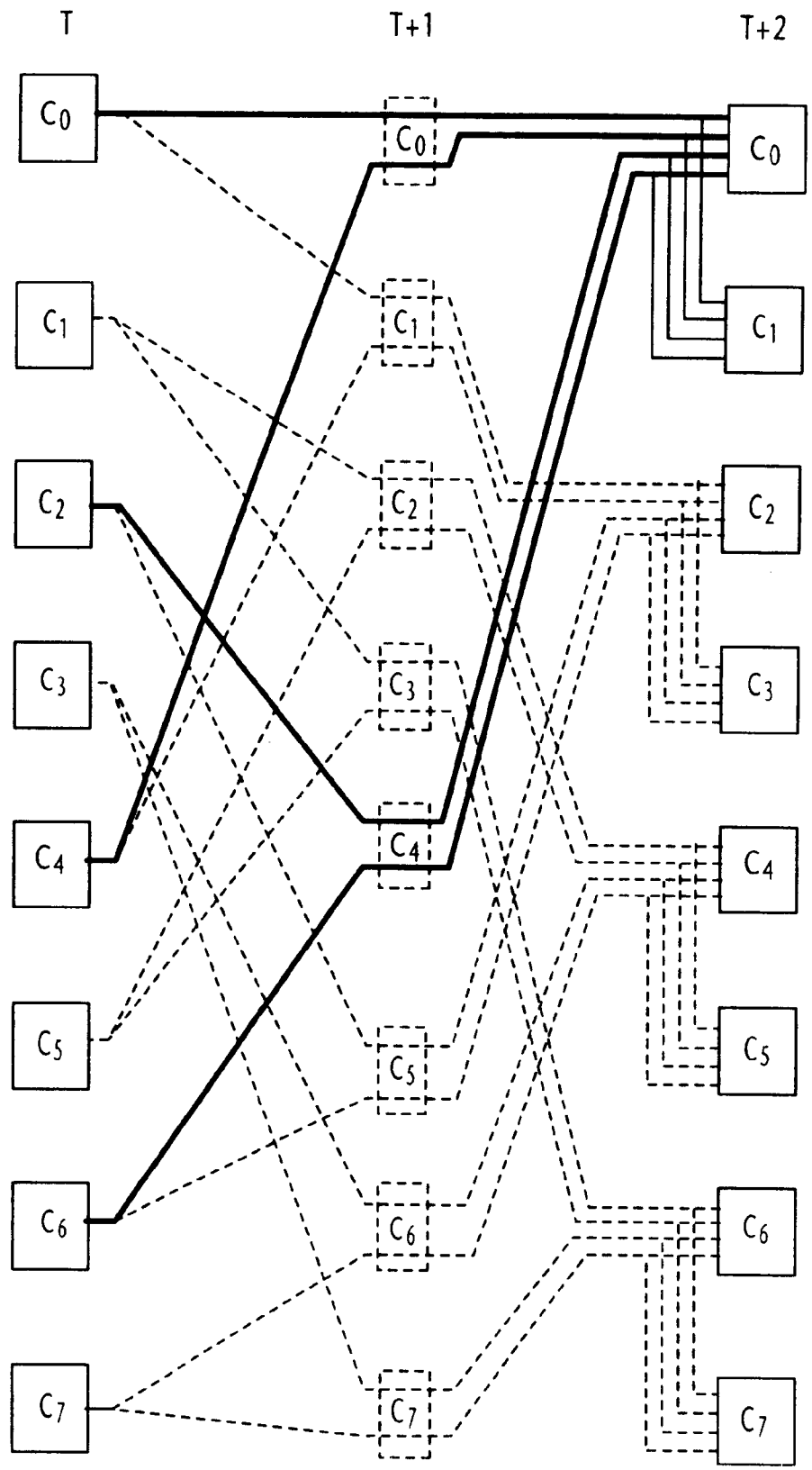
FIG. 10 is a three-stage network of a path memory of the present invention for a Viterbi decoder with a constraint length k=4.

The path memory of the present invention for a Viterbi decoder with a constraint length k=4 is implemented as shown in FIGS. 10, 11, 12A, and 12B. In this case, eight paths are provided. Since preceding memory cells of each subsequent memory cell are separated by a distance of four rows in the case of k=4, each memory cell of stage T+2 in a three-stage configuration has a pair of connections to each of its associated memory cells at stage T+1 separated by four rows, with a total of four input connections of unique pattern as shown in FIG. 10. These input connections further extend to the associated four memory cells of stage T. Similar to the previous embodiment, the third-stage memory cells of FIG. 10 are grouped into four pairs of memory cells, i.e., ($C_0$, $C_1$), ($C_2$, $C_3$), ($C_4$, $C_5$) and ($C_6$, $C_7$) and the memory cells of each pair share the same input connections.

Figure 11:
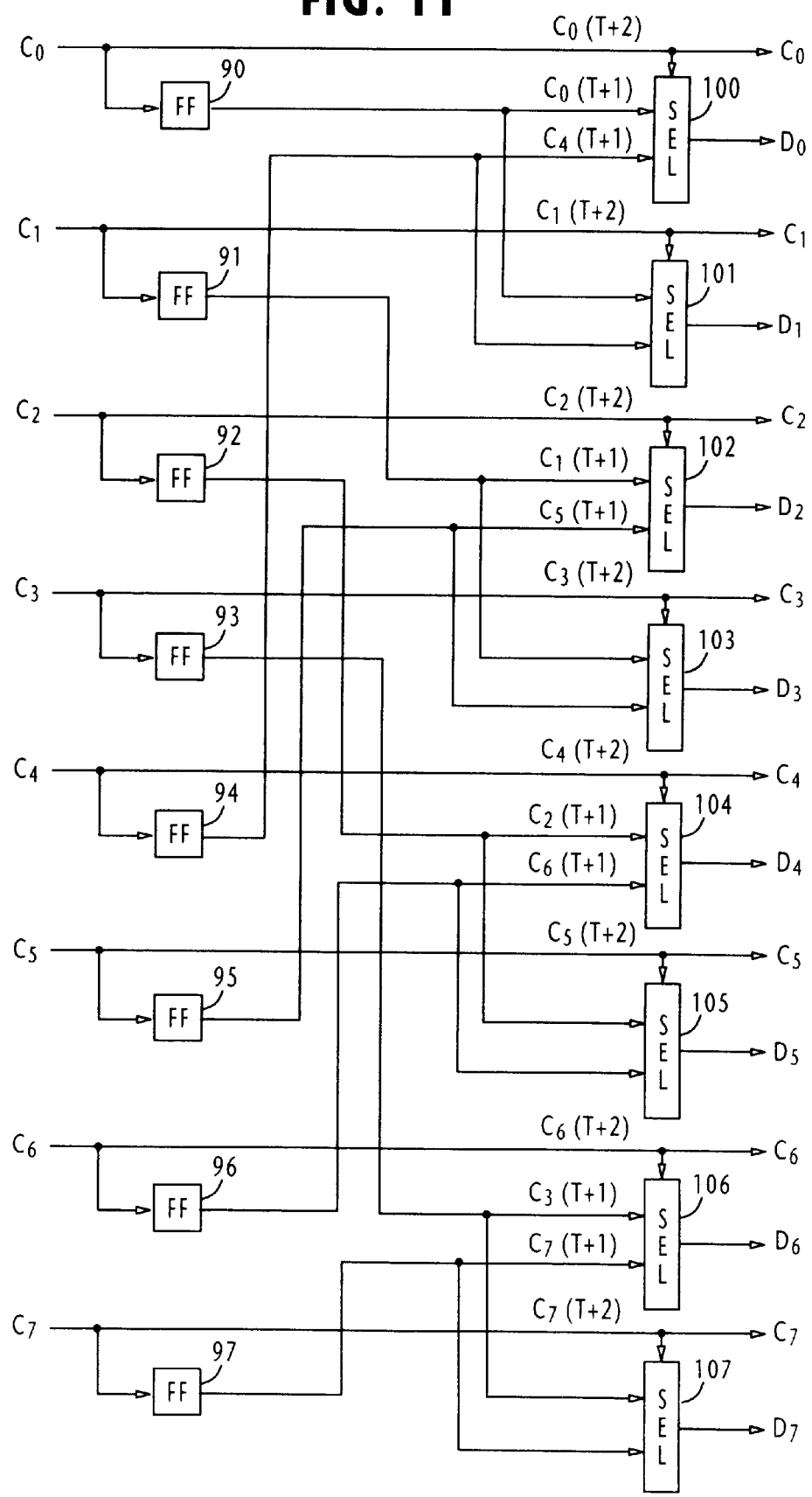
FIG. 11 is a block diagram of path selecting circuitry memory of the present invention for a Viterbi decoder with the constraint length k=4.

As shown in FIG. 11, the path select control circuitry for the path memory with k=4 is comprised by flip-flops 90 to 97 corresponding to the eight paths (states) for delaying the associated path select command signals $C_0$ to $C_7$ supplied from ACS circuits by a T interval to produce delayed path select command signals $C_0(T+1)$ through $C_7(T+1)$. Selectors 100 to 107 are provided respectively for path select command signals $C_0$ to $C_7$. Selector 100, for example, selects one of the delayed path select command signals $C_0(T+1)$ and $C_4(T+1)$ according to the value of the path select command signal $C_0(T+2)$ to produce an output signal $D_0$. In like manner, selectors 101 to 107 produce output signals $D_1$ to $D_7$. The path select command signals $C_0(T+2)$ to $C_7(T+2)$ and the selector output signals $D_0$ to $D_7$ are paired to form a plurality of control signals.

The path memory is divided into two arrays of odd- and even-numbered stages in the same manner as that described in the previous embodiment. In each stage, the memory cells of the first to the fourth rows share the same four input signals, or states 0, 2, 4 and 6 from the preceding stage and the memory cells of the fifth to the eighth rows share the same four input signals, or states 1, 3, 5 and 7.

Figure 12A:
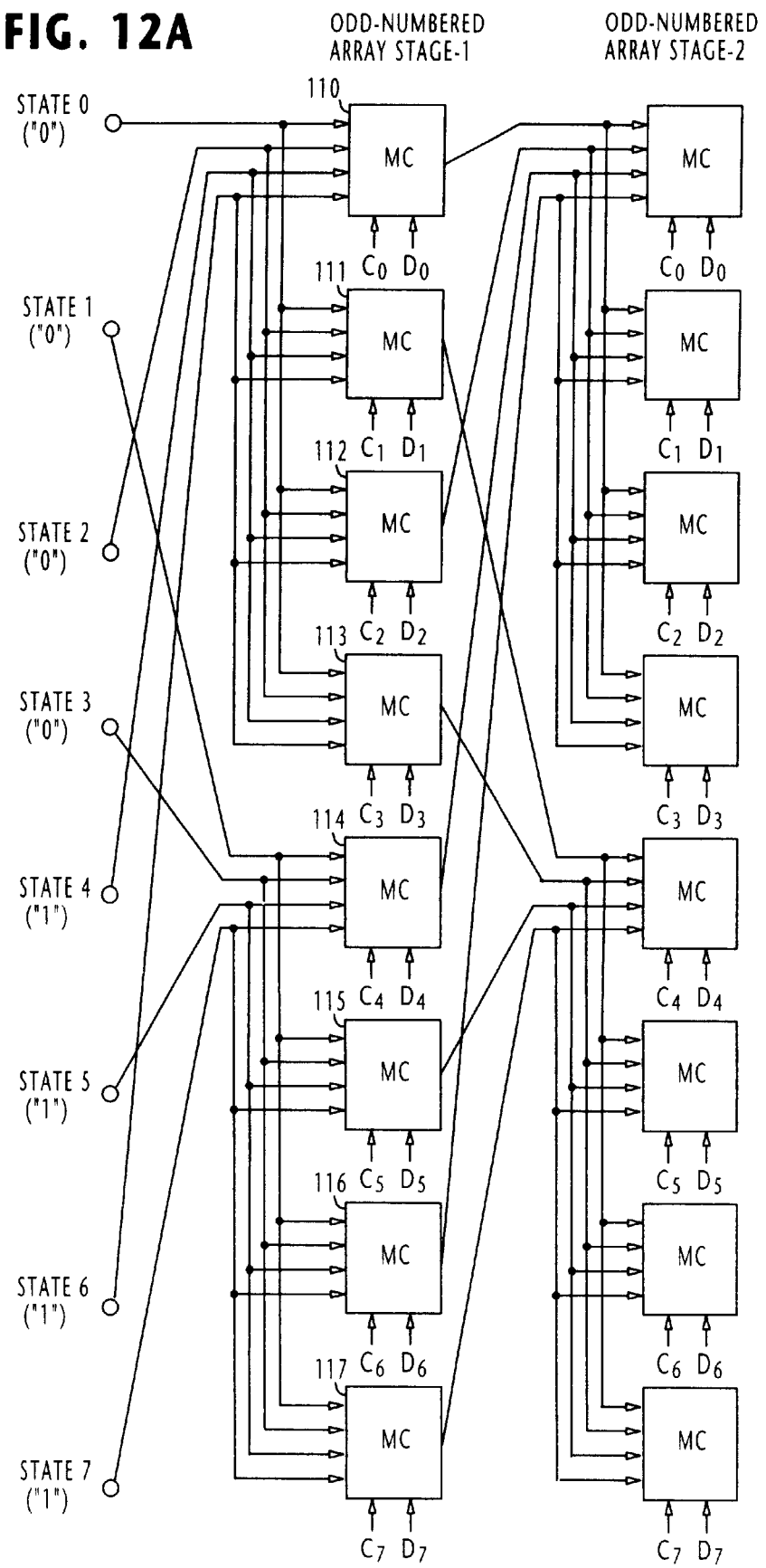
FIGS. 12A and 12B are block diagrams of memory arrays of odd- and even-numbered stages, respectively, for the Viterbi decoder with the constraint length k=4.

More specifically, as shown in FIG. 12A, each stage of the odd-numbered array has eight memory cells 110 to 117. The memory cells 110 to 117 of each stage is separated into upper and lower groups. Those of the upper group of the first stage receive states 0, 2, 4 and 6 which are binary "0", "0", "1", "1", respectively, those of the lower group receiving states 1, 3, 5 and 7 which are binary "0", "0", "1", "1", respectively. The same set of memory cells are provided in subsequent odd-numbered stages and connected to the preceding stages in the same way.

Figure 12B:
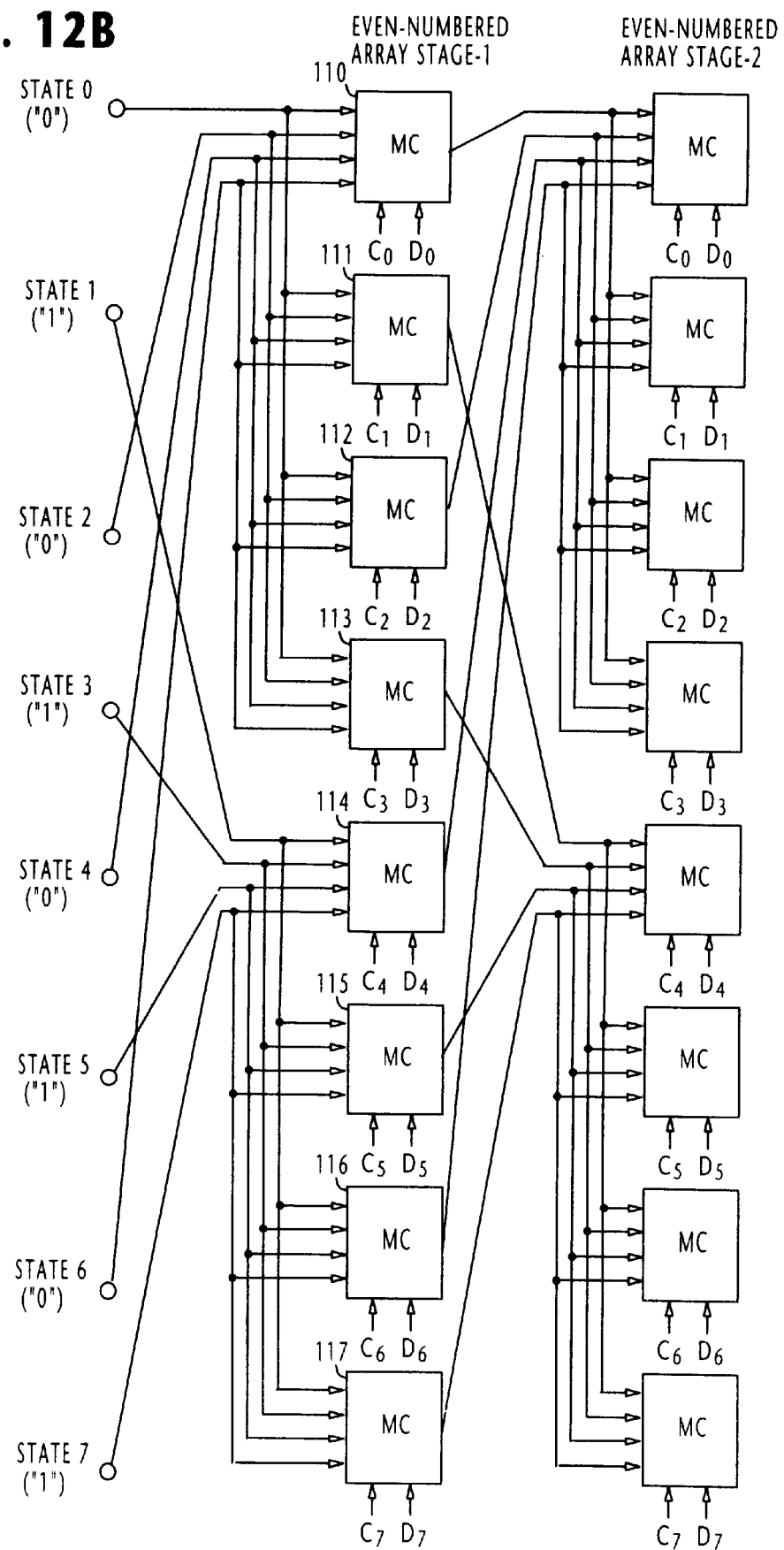

As shown in FIG. 12B, the even-numbered memory array is of similar configuration to that of the odd-numbered memory array except that states 0, 2, 4 and 6 are binary "0", "0", "0" and "0", and states 1, 3, 5 and 7 are binary "1", "1", "1" and "1".

Figure 13:
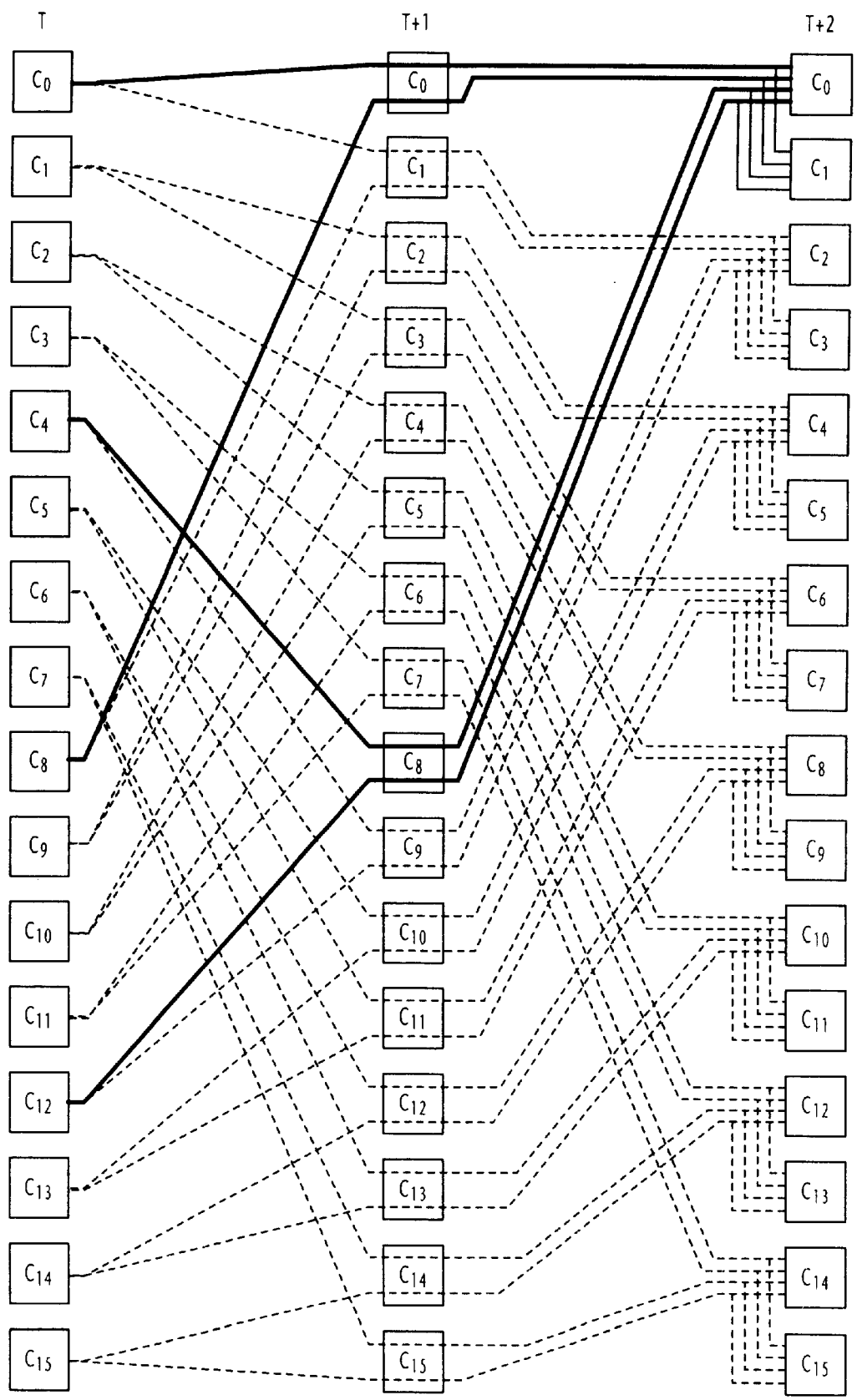
FIG. 13 is a three-stage network of a path memory of the present invention for a Viterbi decoder with a constraint length k=5.

The path memory of the present invention for a Viterbi decoder with the constraint length k=5 may be implemented with a configuration shown in FIG. 13. In this case, 16 paths are provided to respond to corresponding path select command signals $C_0$ to $C_{15}$ and the preceding memory cells of each subsequent memory cell are separated by a distance of eight rows.

What is claimed is:

1. A path memory for a Viterbi decoder, comprising:

path selecting circuitry for producing a plurality of control signals from path select command signals generated by said Viterbi decoder a clock T interval earlier than reference clock timing and from two path select command signals which are generated by said Viterbi decoder a 2T interval earlier than the reference clock timing corresponding to two possible states separated from each other by a predetermined distance; and a matrix array of memory cells arranged in a plurality of rows, said memory cells being divided into a first array of odd-numbered columns and a second array of even-numbered columns, each row of said first-array memory cells being responsive to a corresponding one of said control signals for selecting one of four possible states latched in the memory cells of preceding odd-numbered columns a 2T interval earlier than the reference clock timing, each row of said second-array memory cells being responsive to a corresponding one of said control signals for selecting one of four possible states latched in the memory cells of preceding even-numbered columns a 2T interval earlier than the reference clock timing, said first and second arrays alternately operating at 2T-intervals.

2. A path memory as claimed in claim 1, further comprising means for alternately selecting output states of said first array and output states of said second array.

3. A path memory for a Viterbi decoder which generates $2^{k-1}$ path select command signals at T intervals, where k is the constraint length of a convolutional code, comprising:

path selecting circuitry for storing said $2^{k-1}$ path select command signals generated a T interval earlier than reference clock timing, the path selecting circuitry being responsive to a path select command signal generated at said reference clock timing corresponding to each of a plurality of $2^{k-1}$ rows for selecting, for said each row, one of the stored path select command signals corresponding to two possible states which occur a 2T interval earlier than the reference clock timing and are separated from each other by a distance of $2^{k-2}$ rows; and a matrix array of memory cells arranged in said $2^{k-1}$ rows, said memory cells being divided into a first array of odd-numbered columns and a second array of even-numbered columns, each row of said first-array memory cells being responsive to said row-corresponding path select signal and said selected path select command signal for selecting one of four possible states latched in the memory cells of preceding odd-numbered columns a 2T interval earlier than the reference clock timing, each row of said second-array memory cells being responsive to said row-corresponding path select command signal and said selected path select command signal for selecting one of four possible states latched in the memory cells of preceding even-numbered columns a 2T interval earlier than the reference clock timing, said first and second arrays alternately operating at 2T-intervals.

4. A path memory as claimed in claim 3, further comprising means for alternately selecting output states of said first array and output states of said second array.

5. A path memory as claimed in claim 3, wherein the memory cells of each of said first and second arrays are separated into first and second groups, each of the groups receiving an identical set of states latched in the memory cells of preceding columns.

6. A path memory as claimed in claim 3, wherein said path selecting circuitry comprises:

a plurality of flip-flops for delaying said $2^{k-1}$ path select command signals by a T interval; and a plurality of selectors, each selector receiving a different pair of path select command signals from said $2^{k-1}$ path select command signals, said path select command signals of said pair corresponding to states which are separated in distance by $2^{k-2}$ rows, each of the selectors selecting one of the path select command signals of the pair according to a corresponding one of said $2^{k-1}$ path select command signals.

7. A Viterbi decoder comprising:

a branch metric calculator for producing a plurality of branch metrics from a received convolutional code, each of said branch metrics representing a Hamming distance between a received code word and an estimated code word;

add/compare/select (ACS) circuitry for producing a plurality of path select command signals from said branch metrics at T intervals;

path selecting circuitry for producing a plurality of control signals from path select command signals generated by said ACS circuitry a T interval earlier than reference clock timing and from two path select command signals which are generated by said ACS circuitry a 2T interval earlier than the reference clock timing corresponding to two possible states separated from each other by a predetermined distance; and a matrix array of memory cells arranged in a plurality of rows, said memory cells being divided into a first array of odd-numbered columns and a second array of even-numbered columns, each row of said first-array memory cells being responsive to a corresponding one of said control signals for selecting one of four possible states latched in the memory cells of preceding odd-numbered columns a 2T interval earlier than the reference clock timing, each row of said second-array memory cells being responsive to a corresponding one of said control signals for selecting one of four possible states latched in the memory cells of preceding even-numbered columns a 2T interval earlier than the reference clock timing, said first and second arrays alternately operating at 2T-intervals.

8. A Viterbi decoder as claimed in claim 7, further comprising means for alternately selecting output states of said first array and output states of said second array.

9. A Viterbi decoder comprising:

a branch metric calculator for producing a plurality of branch metrics from a received convolutional code, each of said branch metrics representing a Hamming distance between a received code word and an estimated code word;

add/compare/select (ACS) circuitry for producing $2^{k-1}$ path select command signals from said branch metrics at T intervals, where k is the constraint length of said convolutional code;

path selecting circuitry for storing said $2^{k-1}$ path select command signals generated a T interval earlier than reference clock timing, the path selecting circuitry being responsive to a path select command signal generated at said reference clock timing corresponding to each of a plurality of $2^{k-1}$ rows for selecting, for said each row, one of the stored path select command signals corresponding to two possible states which occur a 2T interval earlier than the reference clock timing and are separated from each other by a distance of $2^{k-2}$ rows; and a matrix array of memory cells arranged in said $2^{k-1}$ rows, said memory cells being divided into a first array of odd-numbered columns and a second array of even-numbered columns, each row of said first-array memory cells being responsive to said row-corresponding path select signal and said selected path select command signal for selecting one of four possible states latched in the memory cells of preceding odd-numbered columns a 2T interval earlier than the reference clock timing, each row of said second-array memory cells being responsive to said row-corresponding path select command signal and said selected path select command signal for selecting one of four possible states latched in the memory cells of preceding even-numbered columns a 2T interval earlier than the reference clock timing, said first and second arrays alternately operating at 2T-intervals.

10. A Viterbi decoder as claimed in claim 9, further comprising means for alternately selecting output states of said first array and output states of said second array.

11. A Viterbi decoder as claimed in claim 9, wherein the memory cells of each of said first and second arrays are separated into first and second groups, each of the groups receiving an identical set of states latched in the memory cells of preceding columns.

12. A Viterbi decoder as claimed in claim 9, wherein said path selecting circuitry comprises:

a plurality of flip-flops for delaying said $2^{k-1}$ path select command signals by a T interval; and a plurality of selectors, each selector receiving a different pair of path select command signals from said $2^{k-1}$ path select command signals, said path select command signals of said pair corresponding to states which are separated in distance by $2^{k-2}$ rows, each of the selectors selecting one of the path select command signals of the pair according to a corresponding one of said $2^{k-1}$ path select command signals.

* * * * *